(12) United States Patent (10) Patent No.: US 8,900,938 B2
Wang (45) Date of Patent: Dec. 2, 2014

(54) MANUFACTURING METHOD OF ARRAY SUBSTRATE, ARRAY SUBSTRATE AND LCD DEVICE

(75) Inventor: Jun Wang, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 258 days.

(21) Appl. No.: 13/579,068

(22) PCT Filed: Jul. 12, 2012

(86) PCT No.: PCT/CN2012/078573
§ 371 (c)(1),
(2), (4) Date: Aug. 15, 2012

(87) PCT Pub. No.: WO2014/005348
PCT Pub. Date: Jan. 9, 2014

(65) Prior Publication Data
US 2014/0001475 A1 Jan. 2, 2014

(30) Foreign Application Priority Data
Jul. 2, 2012 (CN) .......................... 2012 1 0225117

(51) Int. Cl.
*H01L 29/786* (2006.01)
*H01L 21/336* (2006.01)

(52) U.S. Cl.
USPC ...... 438/158; 438/149; 257/59; 257/E21.414; 257/E29.271

(58) Field of Classification Search
CPC .................. H01L 29/78696; H01L 29/78621; H01L 29/7869; H01L 27/1222; H01L 27/1225; H01L 27/1251
USPC ............. 257/59, E29.291, E33.004, E21.414, 257/57, 72, E29.271; 438/104, 158, 161, 438/149
See application file for complete search history.

(56) References Cited

U.S. PATENT DOCUMENTS 6,674,093 B1 * 1/2004 Tanaka et al. .................... 257/72
2006/0252168 A1 * 11/2006 Rhee et al. ....................... 438/28
(Continued)

FOREIGN PATENT DOCUMENTS

CN 2349627 Y 11/1999
CN 1611994 A 5/2005
(Continued)

OTHER PUBLICATIONS

Zhao Ying, the International Searching Authority written comments, Apr. 2013, CN.
(Continued)

*Primary Examiner* — Cheung Lee
*Assistant Examiner* — Jeremy Joy
(74) *Attorney, Agent, or Firm* — IPro, Inc.; Na Xu (57) ABSTRACT

A manufacturing method of the array substrate includes the steps: A. A first mask manufacturing process is adopted to from scan lines and thin film transistor (TFT) gates on a surface of a substrate. B. A second mask manufacturing process is adopted to form scan lines and data lines of the array substrate, a source electrode and a drain electrode of TFT and a conducting channel positioned between the source electrode and the drain electrode. C. A photoresistor formed in the second mask manufacturing process is incinerated, and then, an a-Si film is paved on the surface of the array substrate. D. The photoresistor is stripped to form an undoped active layer. E. A third mask manufacturing process is adopted to form a transparent conducting layer on the surface of the drain electrode of the TFT. Only three mask manufacturing process in the present disclosure are needed to manufacture the entire array substrate.

8 Claims, 7 Drawing Sheets

(56) References Cited

U.S. PATENT DOCUMENTS

| | | | |
|---|---|---|---|
| 2007/0108446 A1* | 5/2007 | Akimoto | 257/61 |
| 2008/0251789 A1* | 10/2008 | Chen | 257/59 |
| 2009/0090912 A1* | 4/2009 | Chen | 257/59 |
| 2009/0186445 A1* | 7/2009 | Akimoto | 438/104 |
| 2009/0294769 A1* | 12/2009 | Irizumi | 257/57 |
| 2010/0065840 A1* | 3/2010 | Yamazaki et al. | 257/43 |
| 2010/0072469 A1* | 3/2010 | Yamazaki et al. | 257/43 |
| 2010/0117075 A1* | 5/2010 | Akimoto et al. | 257/43 |
| 2010/0117077 A1* | 5/2010 | Yamazaki et al. | 257/43 |
| 2010/0117078 A1* | 5/2010 | Kuwabara et al. | 257/43 |
| 2010/0133530 A1* | 6/2010 | Akimoto et al. | 257/43 |
| 2010/0193782 A1* | 8/2010 | Sakata | 257/43 |
| 2011/0165710 A1* | 7/2011 | Yoon et al. | 438/29 |
| 2011/0248275 A1* | 10/2011 | Yamazaki | 257/60 |
| 2011/0303923 A1 | 12/2011 | Noh et al. | |
| 2012/0305925 A1* | 12/2012 | Misaki | 257/59 |

FOREIGN PATENT DOCUMENTS

| | | |
|---|---|---|
| CN | 1961256 A | 5/2007 |
| CN | 101339358 A | 1/2009 |
| CN | 101599497 A | 12/2009 |
| CN | 101894807 A | 11/2010 |
| CN | 102262340 A | 11/2011 |
| CN | 102299104 A | 12/2011 |
| EP | 1427021 A1 | 6/2004 |
| JP | H04367268 A | 12/1992 |

OTHER PUBLICATIONS

Ma Meijuan, the International Searching Authority written comments, Nov. 2012, CN.

\* cited by examiner

Figure 15

MANUFACTURING METHOD OF ARRAY SUBSTRATE, ARRAY SUBSTRATE AND LCD DEVICE

This application is a national stage application of PCT application PCT/CN2012/078573 filed on Jul. 12, 2012, which is based on and claims priority to Chinese patent application 201210225117.0 filed on Jul. 2, 2012. The entirety of each of the above-mentioned applications is hereby incorporated by reference herein in its entirety.

TECHNICAL FIELD

The present disclosure relates to the field of displays, and more particularly to a manufacturing method of an array substrate, an array substrate and a liquid crystal display (LCD) device.

BACKGROUND

In a flat display device, a Thin Film Transistor Liquid Crystal Display (TFT-LCD) has features of small volume, low power consumption, relatively lower manufacturing cost, no radiation and other features, and occupies a leading status in current flat panel display markets. The TFT-LCD is formed by involution of an array substrate and a color filter substrate, wherein the array substrate is mainly manufactured by a 5 mask or 4 mask technology currently. In each photomask manufacturing technology, several steps of washing, drying, film formation, photoetching. shall be gone through. Because there are many procedures in yield, high cost and other problems inevitably exist.

SUMMARY

In view of the above-described technical problems, an aim of the present disclosure is to provide a manufacturing method of an array substrate, an array substrate and a liquid crystal display (LCD) device with few technological processes, low cost and high yield.

The aim of the present disclosure is achieved by the following technical scheme:

A manufacturing method of an array substrate comprises the following steps:

A. A first mask manufacturing process is adopted to from scan lines and TFT gates on a surface of a substrate.

B. An insulating layer, a second metal layer and an n+a-Si film are successively paved on the substrate. Then, a second mask manufacturing process is adopted to form scan lines and data lines of the array substrate, a source electrode and a drain electrode of TFT, and a conducting channel positioned between the source electrode and the drain electrode.

C. A photoresistor formed in the second mask manufacturing process is incinerated to expose the n+a-Si film on both ends of the conducting channel. Then, an a-Si film is paved on the surface of the array substrate, and the formed a-Si film and the n+a-Si film on both ends of the conducting channel are reliably and electrically connected.

D. The photoresistor is stripped, the a-Si material covered on the surface of the photoresistor is also removed, and the remaining a-Si film forms an undoped active layer;

E. A third mask manufacturing process is adopted. The n+a-Si film covered by an undoped active layer is reserved to form a doped active layer. Then, a transparent conducting layer is formed on the surface of the drain electrode of TFT.

Preferably, in the step E, the undoped active layer is used as a mask body, and the n+a-Si film outside the covering part of the undoped active layer is etched off to form a doped active layer; Then, the third mask manufacturing process is used to form a transparent conducting layer on a TFT surface. This is a specific manufacturing technology of a doped active layer.

In one example, in the step E, firstly, a mask manufacturing process is adopted to form a pattern of a transparent conducting layer on the surface of the array substrate. Then, the n+a-Si material outside the covering part of the undoped active layer is removed in an exposing, developing and etching modes, and the reserved n+a-Si material forms a doped active layer. Then, a layer of transparent conducting colloid is paved, and the remaining photoresist and the conducting colloid covered on the surface of the photoresist are stripped, so that the transparent conducting layer is formed. This is a specific manufacturing technology of another doped active layer.

In one example, in the step E, a mask manufacturing process is used to form a transparent conducting layer synchronously on the surfaces of the source electrode and the drain electrode of the TFT. The transparent conducting layer is also paved on the source electrode. For the source electrode, the transparent conducting layer can perform a protecting function. Additionally, the transparent conducting layer on the source electrode and the transparent conducting layer on the drain electrode can be synchronously formed, and a manufacturing process is not added additionally.

In one example, the step A comprises the steps:

A1. A first metal layer is deposited on the substrate.

A2. A first layer of photoresist is coated on the first metal layer. Then, patterns of scan lines and TFT gates of the array substrate are made through exposure and development. Thus, the first layer of photoresistor is formed.

A3. The first metal layer is etched. Then, the first layer of photoresistor is stripped to form scan lines and TFT gates of the array substrate.

The step B comprises the steps:

B1. An insulating layer, a second metal layer and an n+a-Si film are deposited successively on the substrate.

B2. A second layer of photoresist is coated on the n+a-Si film, and a second layer of photoresistor is formed through exposure and development. The second layer of photoresistor forms a notch at a region above the gates, and the notch is divided into a first square notch on an bottom and a second square notch positioned on an opening. A width of the second square notch is larger than the width of the first square notch.

B3. The second layer of photoresistor is used as a mask body for etching off n+a-Si film material on the first square notch.

B4. After the n+a-Si film material on the first square notch is stripped, the exposed second metal layer is continuously etched to form a source electrode and a drain electrode of TFT and data lines of the array substrate. Meanwhile, a conducting channel with the same width as the first square notch is also formed between the cut-off n+a-Si film and the second metal layer;

The step C comprises the steps:

C1. The second layer of photoresistor is incinerated for reducing the thickness of the photoresistor, and the n+a-Si film covered by both ends of the first square notch is exposed.

C2. An a-Si film is deposited on the substrate, and the a-Si film covers the surfaces of the exposed n+a-Si film and the conducting channel.

The step E comprises the steps:

E1. The undoped active layer is used as a mask body, the n+a-Si film material outside the covering region of the undoped active layer is etched off, and the remaining n+a-Si film forms the doped active layer.

E2. The third layer of photoresist is adopted, and then, the third layer of photoresistor is formed on the region of the undoped active layer through exposure and development.

E3. The transparent conducting layer is deposited on the substrate, and the transparent conducting layer covers on the surfaces of the source electrode and the drain electrode of the TFT.

E4. The third layer of photoresistor is stripped together with the transparent conducting layer on the surface of the third layer of photoresistor to form a pixel electrode of the TFT.

This is a specific manufacturing method of the array substrate.

In one example, in the step E, a mask manufacturing process is used to form a transparent conducting layer synchronously on the surfaces of the source electrode and the drain electrode of the TFT. The surface of the source electrode is also covered with the transparent conducting layer which can perform a protection function for the source electrode. Additionally, the transparent conducting layer on the source electrode and the transparent conducting layer on the drain electrode can be synchronously formed, and a manufacturing process is not additionally added.

An array substrate comprises a TFT structure. The TFT structure comprises gates, an insulating layer, a metal layer and a doped active layer successively from the bottom. The region above the gates is configured with a conducting channel, and the conducting channel cuts off the doped active layer and the metal layer. The cut-off metal layer is divided into a source electrode and a drain electrode, the surface of the drain electrode is covered with a transparent conducting layer, and the surface of the doped active layer and the inner part of the conducting channel are covered with the undoped active layer.

In one example, the surface of the source electrode is also covered with a transparent conducting layer. The transparent conducting layer is also paved on the source electrode, so that for the source electrode, the transparent conducting layer can perform a protecting function. Additionally, the transparent conducting layer on the source electrode and the transparent conducting layer on the drain electrode can be synchronously formed, and a manufacturing process is not additionally added.

In one example, the TFT structure is axially symmetrical with respect to the central line of the conducting channel. By adopting a symmetrical structure, the design can be simplified and design cost is reduced.

In one example, the doped active layer adopts n+a-Si material, and the undoped active layer adopts a-Si material. This is a specific material of an doped active layer and an undoped active layer.

An LCD device comprises the aforementioned array substrate.

In the present disclosure, the doped active layer and the undoped active layer are arranged on the upper part, while the source electrode and the drain electrode are positioned on the lower part. The manufacturing process of one layer of mask is adopted for simultaneously forming the source electrode, the drain electrode and the doped active layer. The thickness of the photoresist is reduced by incinerating the photoresist. Thus, the doped active layer positioned on a higher position on both ends of the conducting channel is exposed; at this moment, the a-Si material is paved to connect the doped active layer on both ends of the conducting channel. Finally, the photoresist is completely stripped, and the a-Si material on the region of the conducting channel is reserved to form the undoped active layer. Thus, by adopting the present disclosure, only one mask manufacturing process is needed for simultaneously forming the source electrode, the drain electrode, the doped active layer and the undoped active layer. A mask manufacturing process of the TFT gates is added, and the transparent conducting layer of the pixel electrode of TFT also needs one mask manufacturing process. Only three mask manufacturing processes are needed to manufacture the entire array substrate in the present disclosure. the time of the manufacturing processes is reduced and manufacturing cost is reduced compared with the typical four and five mask manufacturing processes. The simplification of the steps also favors enhancement of yield.

DETAILED DESCRIPTION

Figure 15:
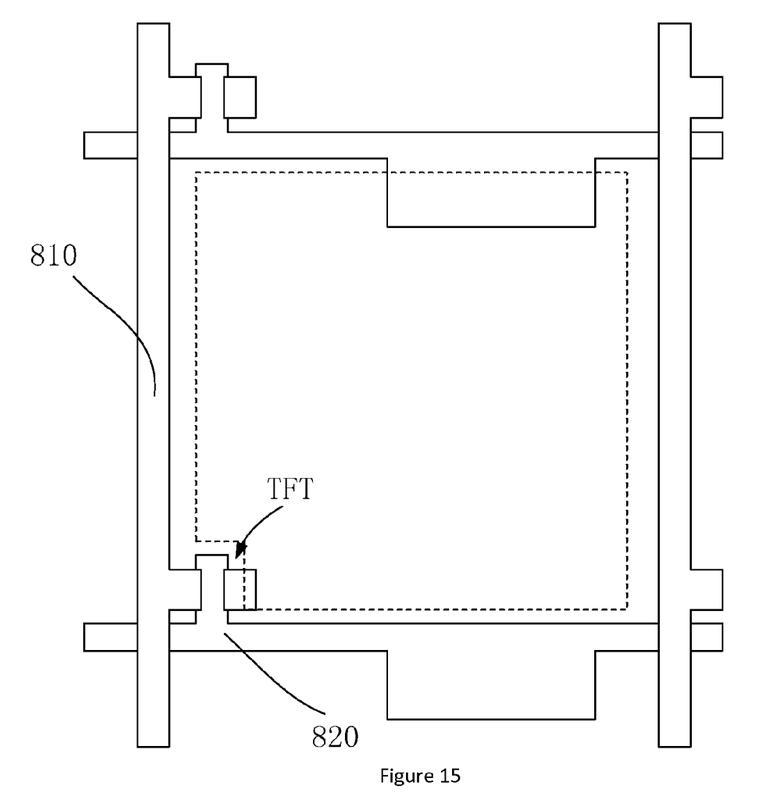
FIG. 15 is an integral schematic diagram of an array substrate of the present disclosure.

The present disclosure discloses a liquid crystal display (LCD) device which comprises an array substrate. As shown in FIG. 15, the array substrate is configured with scan lines 810 and data lines 820 which are criss-cross, and a thin film transistor (TFT). A source electrode of the TFT is connected with the data lines, gates are connected with the scan lines, and a drain electrode is connected with a pixel electrode of the TFT.

Figure 14:
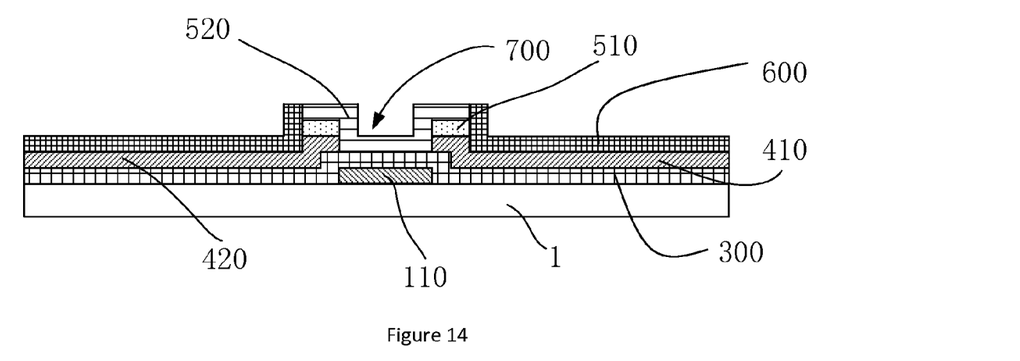
FIG. 14 is a schematic diagram of step n of example 1 of the present disclosure.

As shown in FIG. 14, a TFT structure of the present disclosure comprises gates 110, an insulating layer 300, a metal layer and a doped active layer 510 successively from a bottom. A region above the gates is configured with a conducting channel 700, and the conducting channel cuts off the doped active layer and the metal layer. The cut-off metal layer is divided into a source electrode 420 and a drain electrode 410, surfaces of the source electrode and the drain electrode are covered with a transparent conducting layer 600, and the surface of the doped active layer and an inner part of the conducting channel are covered with the undoped active layer

520. The doped active layer adopts n+a-Si material, and the undoped active layer adopts a-Si material. In the present disclosure, each TFT structure is axially symmetrical with respect to a central line of the conducting channel.

Optionally, the transparent conducting layer forms the pixel electrode of the TFT; thus, it is feasible that the transparent conducting layer only covers the drain electrode. Only the transparent conducting layer is also paved on the source electrode, so that for the source electrode, the transparent conducting layer can perform a protecting function. Additionally, the transparent conducting layer on the source electrode and the transparent conducting layer on the drain electrode can be synchronously formed, and a manufacturing process is not additionally added. Thus, the influence on the cost is very small.

The present disclosure also discloses a manufacturing method of the array substrate. The present disclosure will further be described in detail in accordance with the figures and the preferable examples.

EXAMPLE 1

Figure 1:
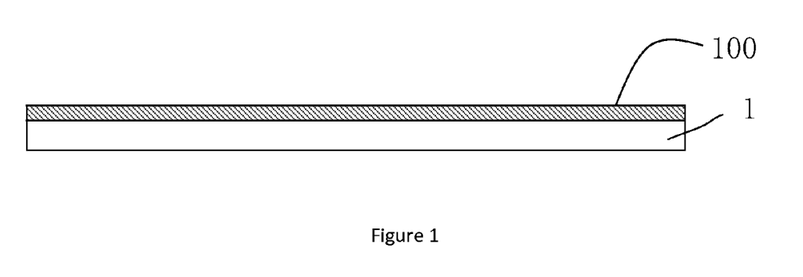
FIG. 1 is a schematic diagram of step a of example 1 of the present disclosure.
Figure 2:
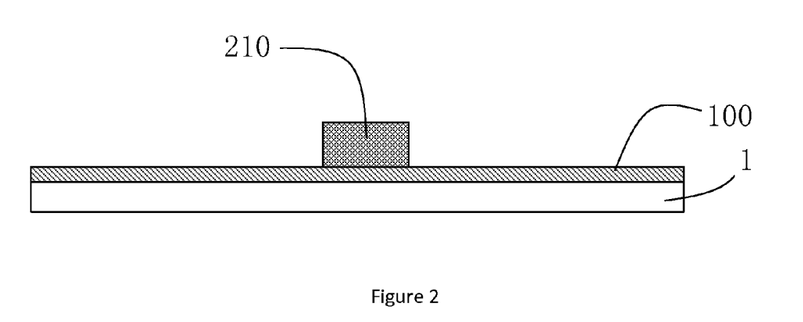
FIG. 2 is a schematic diagram of step b of example 1 of the present disclosure.
Figure 3:
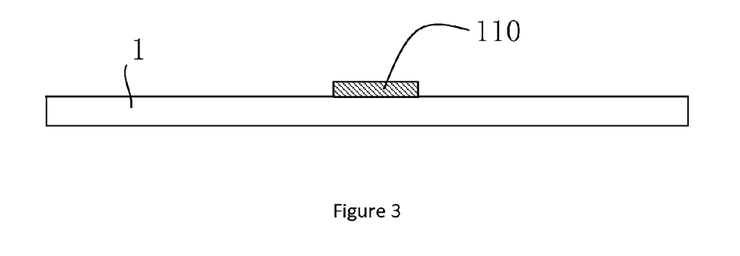
FIG. 3 is a schematic diagram of step c of example 1 of the present disclosure.
Figure 4:
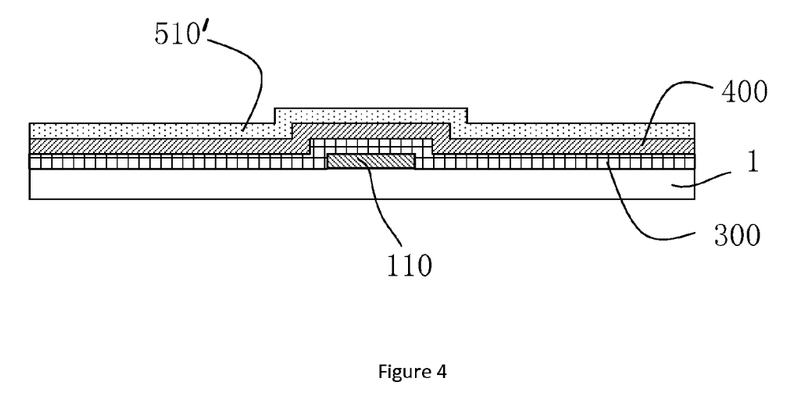
FIG. 4 is a schematic diagram of step d of example 1 of the present disclosure.
Figure 5:
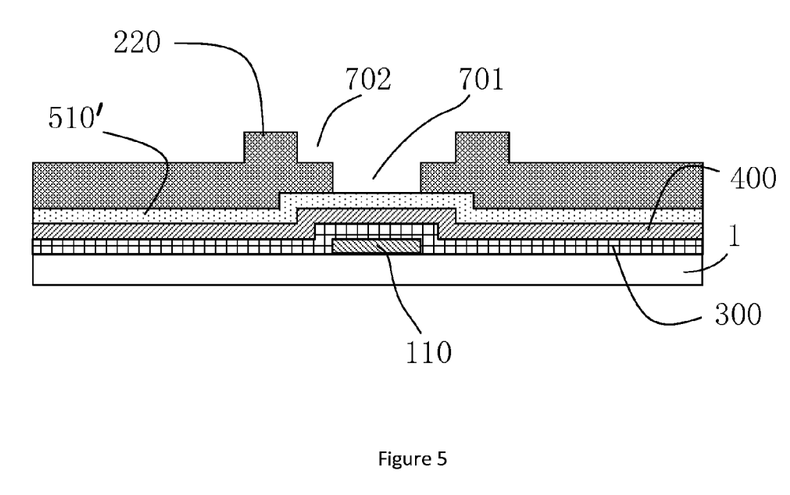
FIG. 5 is a schematic diagram of step e of example 1 of the present disclosure.
Figure 6:
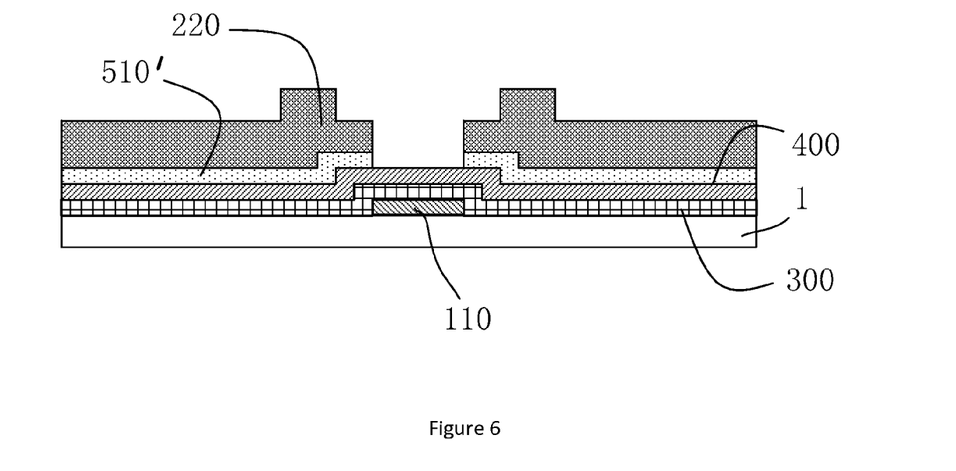
FIG. 6 is a schematic diagram of step f of example 1 of the present disclosure.
Figure 7:
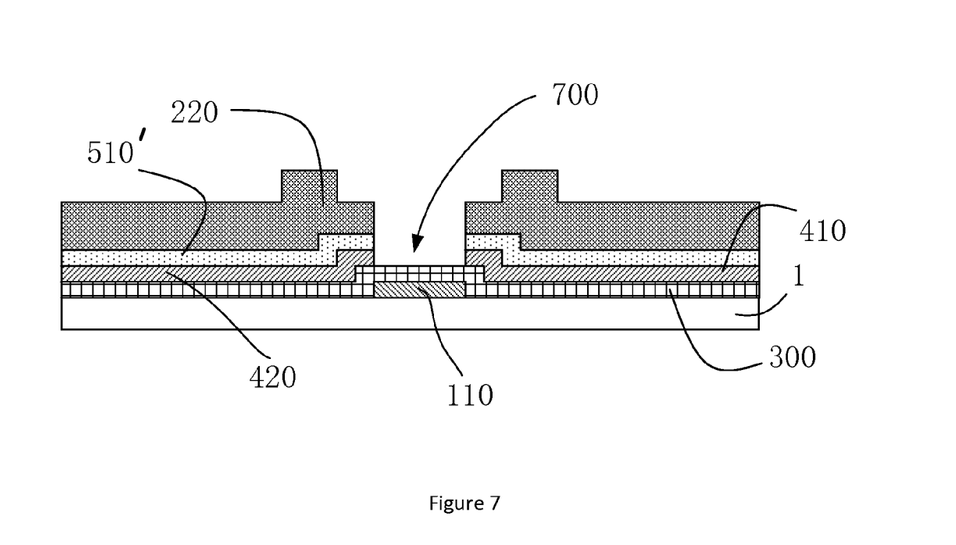
FIG. 7 is a schematic diagram of step g of example 1 of the present disclosure.
Figure 8:
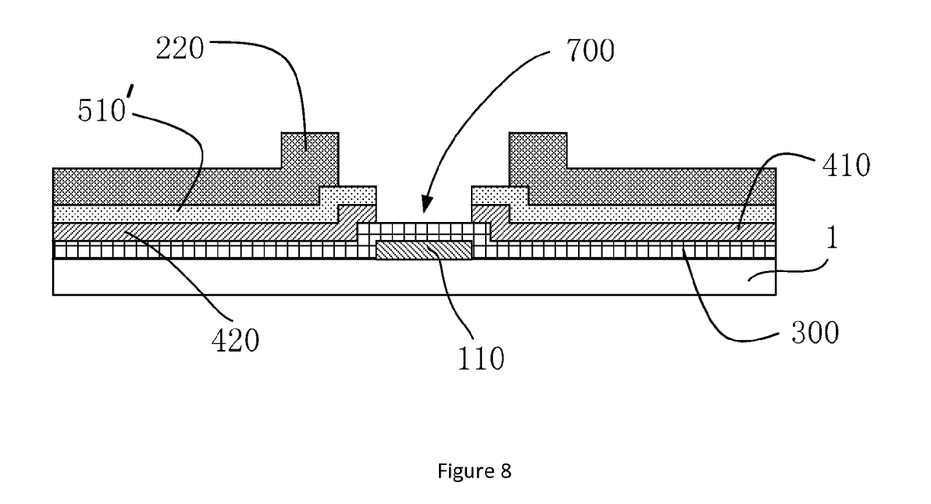
FIG. 8 is a schematic diagram of step h of example 1 of the present disclosure.
Figure 9:
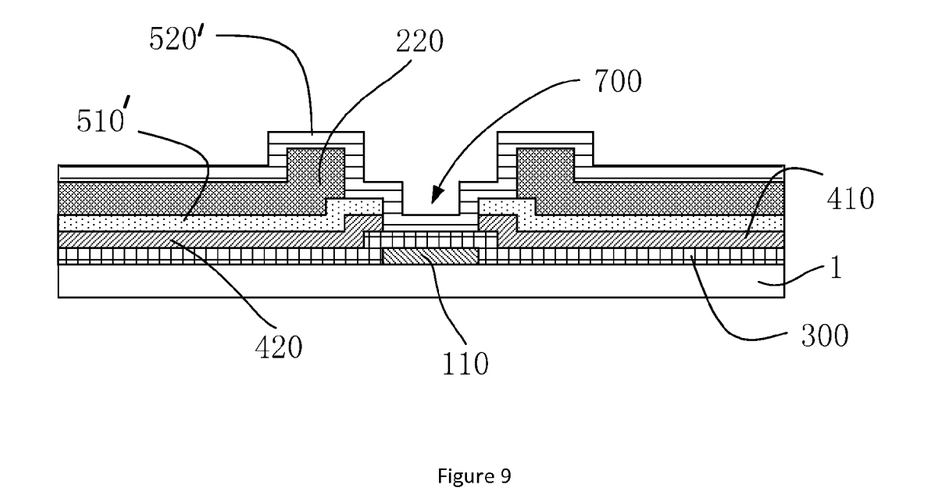
FIG. 9 is a schematic diagram of step i of example 1 of the present disclosure.
Figure 10:
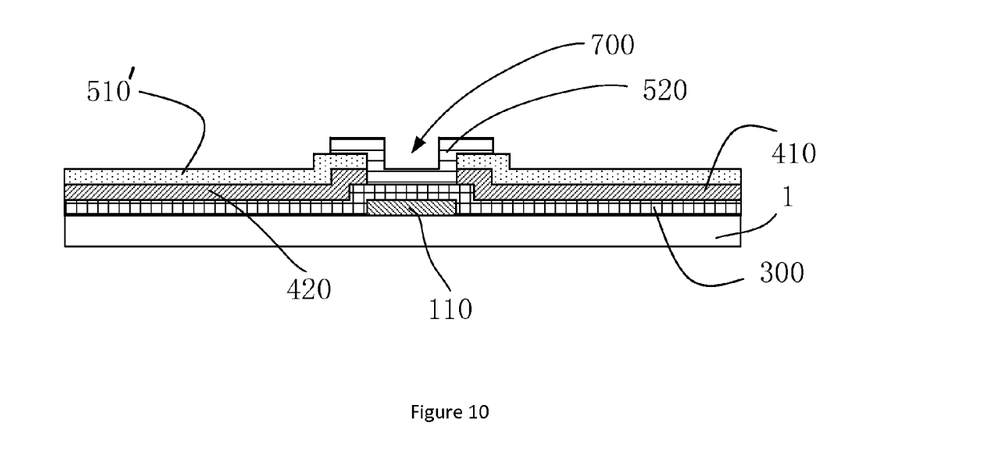
FIG. 10 is a schematic diagram of step j of example 1 of the present disclosure.
Figure 11:
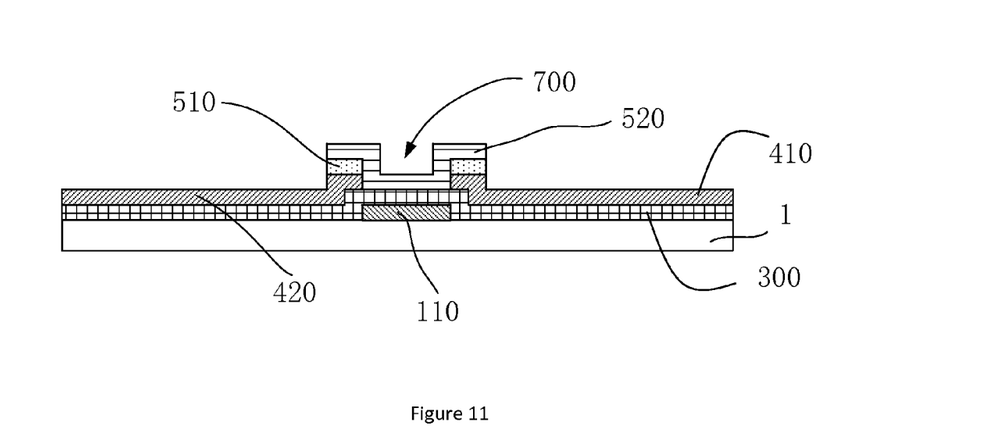
FIG. 11 is a schematic diagram of step k of example 1 of the present disclosure.
Figure 12:
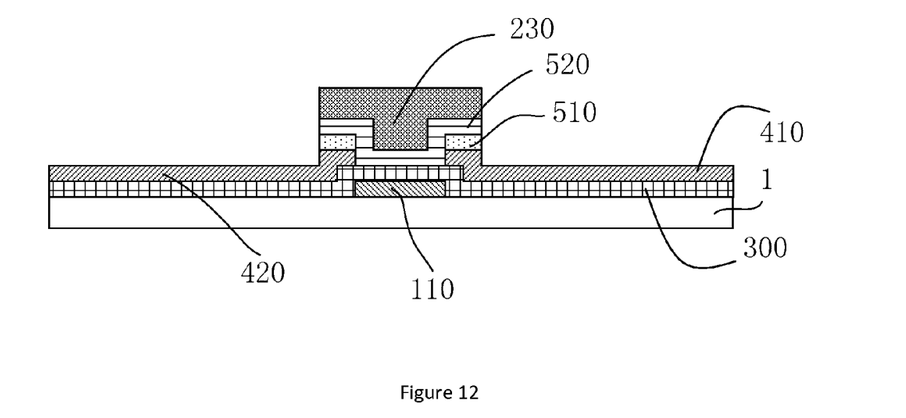
FIG. 12 is a schematic diagram of step l of example 1 of the present disclosure.
Figure 13:
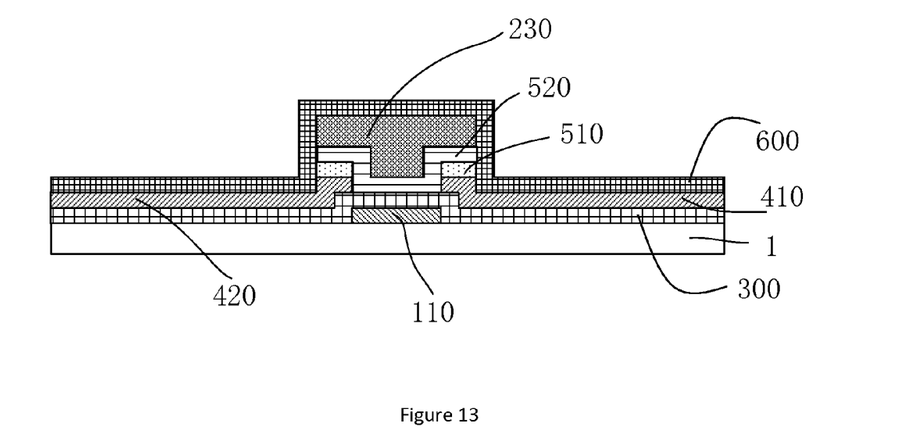
FIG. 13 is a schematic diagram of step m of example 1 of the present disclosure.

This is an example which comprises the steps:

a. As shown in FIG. 1, a first metal layer 100 is deposited on a cleaned and dry substrate.

b. As shown in FIG. 2, a first layer of photoresist is coated on the first metal layer. Then, patterns of scan lines and TFT gates of the array substrate are made through exposure and development Thus, the first layer of photoresistor 210 is formed.

c. As shown in FIG. 3, the first metal layer is etched, and then, the first layer of photoresist is stripped to form scan lines and TFT gates of the array substrate.

d. As shown in FIG. 4, an insulating layer (SiNx material), a second metal layer 400 and an n+a-Si film 510' are deposited successively on the substrate 1.

e. As shown in FIG. 5, a second layer of photoresist is coated on the n+a-Si film 510'. A second layer of photoresistor is formed through exposure and development. The second layer of photoresistor forms a "T"-shaped notch at the region above the gates, and the notch is divided into a first square notch 701 on the bottom and a second square notch 702 positioned on an opening. The width of the second square notch 702 is larger than the width of the first square notch 701.

f. As shown in FIG. 6, the second layer of photoresistor 220 is used as a mask body for etching off n+a-Si film 510' material on the first square notch 701.

g. As shown in FIG. 7, after the n+a-Si film material on the first square notch 701 is stripped, the exposed second metal layer is continuously etched to form a source electrode, a drain electrode of TFT and data lines of the array substrate. Meanwhile, a conducting channel 700 with the same width as the first square notch 701 is also formed between the cut-off n+a-Si film 510' and the second metal layer.

h. As shown in FIG. 8, the second layer of photoresistor is incinerated, so that the thickness of the photoresistor is reduced, and the first square notch 701 disappears. At this moment, the n+a-Si film 510' covered by both ends of the first square notch is 701 is exposed.

i. As shown in FIG. 9, an a-Si film 520' is deposited on the substrate 1, and the a-Si film 520' covers the surfaces of the exposed n+a-Si film 510' and the conducting channel.

j. As shown in FIG. 10, the second layer of photoresistor is stripped, and the a-Si film covering on the surface of the photoresistor is also removed. The remaining a-Si film forms an undoped active layer 520.

k. As shown in FIG. 11, the undoped active layer is used as a mask body, and the n+a-Si film material outside the covering region of the undoped active layer is etched off. The remaining n+a-Si film forms the doped active layer 510.

l. As shown in FIG. 12, the third layer of photoresist is adopted, and then, the third layer of photoresistor 230 is formed on the region of the undoped active layer through exposure and development;

m. As shown in FIG. 13, a transparent conducting layer 600 (such as ITO) is deposited on the substrate 1. The transparent conducting layer is respectively connected with the source electrode and the drain electrode of the TFT.

n. As shown in FIG. 14, the third layer of photoresistor is stripped together with the transparent conducting layer on the surface of the third layer of photoresistor to form a pixel electrode of the TFT.

To the end, necessary components of the entire array substrate are completely formed. Only three photomask technologies in the whole manufacturing process are needed to manufacture the entire array substrate. The time of the manufacturing process is reduced and manufacturing cost is reduced compared with the typical four and five mask manufacturing processes, and the simplification of the steps also favors enhancement of yield.

Certainly, the third layer of photoresistor can cover one side of the whole source electrode region. After the transparent conducting layer is deposited and the third layer of photoresistor is stripped, the source electrode part does not have the transparent conducting layer and only the drain electrode part forms the transparent conducting layer.

EXAMPLE 2

Difference between the example 2 and the example 1 starts from step k. After the undoped active layer is formed, in the example 2, the third layer of photoresist is firstly adopted, and then, the third layer of photoresistor in the region of the undoped active layer is reserved through exposure and development. The third layer of photoresistor is used as a mask body for etching off the exposed n+a-Si film, and the remaining n+a-Si film forms a doped active layer. Finally, a transparent conducting layer (such as ITO) is deposited on the substrate, and the transparent conducting layer is respectively connected with the source electrode and the drain electrode of the TFT. Then, the third layer of photoresistor is stripped together with the transparent conducting layer on the surface of the third layer of photoresistor to form a pixel electrode of the TFT. Certainly, the third layer of photoresistor can cover one side of the whole source electrode region. After the transparent conducting layer is deposited and the third layer of photoresistor is stripped, the source electrode part does not have the transparent conducting layer and only the drain electrode part forms the transparent conducting layer.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

I claim:
1. A manufacturing method of an array substrate, comprising the following steps:
   A. adopting a first mask manufacturing process to from a scan line(s) and a thin film transistor (TFT) gate(s) on a surface of a substrate;
   B. successively paving an insulating layer, a second metal layer and an n+a-Si film on the substrate; then, adopting a second mask manufacturing process to form a scan line(s) and a data line(s) of the array substrate, a source electrode and a drain electrode of the thin film transistor (TFT), and a conducting channel positioned between the source electrode and the drain electrode;
   C. incinerating a photoresistor formed in the second mask manufacturing process to expose the n+a-Si film on both ends of the conducting channel; then, paving an a-Si film on a surface of the array substrate and forming reliably electric connection between the formed a-Si film and the n+a-Si film on both ends of the conducting channel;
   D. stripping the photoresistor and also removing the a-Si material covering the surface of the photoresistor; forming an undoped active layer by the remaining a-Si film;
   E. adopting a third mask manufacturing process, and reserving the n+a-Si film on the covering part of the undoped active layer to form a doped active layer; then, forming a transparent conducting layer on the surface of the drain electrode of the thin film transistor (TFT).

2. The manufacturing method of the array substrate of claim 1, wherein in the step E, a mask manufacturing process is used to form a transparent conducting layer synchronously on the surfaces of the source electrode and the drain electrode of the TFT.

3. The manufacturing method of the array substrate of claim 1, wherein in the step E, the undoped active layer is used as a mask body, and the n+a-Si film outside the covering part of the undoped active layer is etched off to form a doped active layer; then, the third mask manufacturing process is used to form a transparent conducting layer on the TFT surface.

4. The manufacturing method of the array substrate of claim 3, wherein in the step E, a mask manufacturing process is used to form a transparent conducting layer synchronously on the surfaces of the source electrode and the drain electrode of the TFT.

5. The manufacturing method of the array substrate of claim 1, wherein in the step E, firstly, a mask manufacturing process is adopted to form a pattern of a transparent conducting layer on the surface of the array substrate; then, the n+a-Si material outside the covering part of the undoped active layer is removed in an etching mode through exposure and development; the reserved n+a-Si material forms a doped active layer; then, a layer of transparent conducting colloid is paved, and the remaining photoresist and the conducting colloid covering the surface are stripped to form the transparent conducting layer.

6. The manufacturing method of the array substrate of claim 5, wherein in the step E, a mask manufacturing process is used to form a transparent conducting layer synchronously on the surfaces of the source electrode and the drain electrode of the TFT.

7. The manufacturing method of the array substrate of claim 1, wherein the step A comprises the following steps:

A1. depositing a first metal layer on the substrate;
   A2. coating a first layer of photoresist on the first metal layer; then, making patterns of the scan lines and the TFT gates of the array substrate through exposure and development, to form the first layer of photoresistor;
   A3. etching the first metal layer; then, stripping the first layer of photoresistor to form the scan lines and the TFT gates of the array substrate;
   wherein the step B comprises the following steps:
   B1. successively depositing an insulating layer, a second metal layer and an n+a-Si film on the substrate;
   B2. coating a second layer of photoresist on the n+a-Si film, forming a second layer of photoresistor through exposure and development, and forming a notch in the second layer of photoresistor at the region above the gates; the notch is divided into a first square notch on the bottom and a second square notch positioned on an opening; the width of the second square notch is larger than the width of the first square notch;
   B3. using the second layer of photoresistor as a mask body for etching off the n+a-Si film material on the first square notch;
   B4. After the n+a-Si film material on the first square notch is stripped, continuously etching the exposed second metal layer to form a source electrode, a drain electrode of TFT and data lines of the array substrate; meanwhile, a conducting channel with the same width as the first square notch is also formed between the cut-off n+a-Si film and the second metal layer;
   wherein the step C comprises the following steps:
   C1. incinerating the second layer of photoresistor for reducing the thickness of the photoresistor, and exposing the n+a-Si film covered by both ends of the first square notch;
   C2. depositing an a-Si film on the substrate, and covering the surfaces of the exposed n+a-Si film and the conducting channel by the a-Si film;
   wherein the step E comprises the following steps:
   E1. using the undoped active layer as a mask body, etching off the n+a-Si film material outside the covering region of the undoped active layer and forming the doped active layer by the remaining n+a-Si film;
   E2. adopting the third layer of photoresist; then, forming the third layer of photoresistor on the region of the undoped active layer through exposure and development;
   E3. depositing the transparent conducting layer on the substrate, and covering the surfaces of the source electrode and the drain electrode of the TFT by the transparent conducting layer;
   E4. stripping the third layer of photoresistor, and also removing the transparent conducting layer on the surface of the third layer of photoresistor to form a pixel electrode of TFT.

8. The manufacturing method of the array substrate of claim 7, wherein in the step E, a mask manufacturing process is used to form a transparent conducting layer synchronously on the surfaces of the source electrode and the drain electrode of the TFT.

* * * * *